(12) United States Patent
Uchida et al.

(10) Patent No.: US 11,501,995 B2
(45) Date of Patent: Nov. 15, 2022

(54) PLASMA PROCESSING APPARATUS AND MOUNTING TABLE THEREOF

(71) Applicant: TOKYO ELECTRON LIMITED, Tokyo (JP)

(72) Inventors: Yohei Uchida, Miyagi (JP); Jun Hirose, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 149 days.

(21) Appl. No.: 16/737,267

(22) Filed: Jan. 8, 2020

(65) Prior Publication Data

US 2020/0219753 A1 Jul. 9, 2020

(30) Foreign Application Priority Data

Jan. 9, 2019 (JP) .............................. JP2019-001971

(51) Int. Cl.
*H01L 21/687* (2006.01)
*H01L 21/683* (2006.01)
*H01J 37/32* (2006.01)

(52) U.S. Cl.
CPC .. *H01L 21/68742* (2013.01); *H01J 37/32642* (2013.01); *H01J 37/32715* (2013.01); *H01L 21/6831* (2013.01); *H01L 21/68735* (2013.01); *H01J 2237/2007* (2013.01); *H01J 2237/334* (2013.01)

(58) Field of Classification Search
CPC ........... H01L 21/68742; H01L 21/6831; H01L 21/68735; H01J 37/32642; H01J 37/32715; H01J 2237/2007; H01J 2237/334

USPC .................................................... 156/345.52
See application file for complete search history.

(56) References Cited

U.S. PATENT DOCUMENTS

| | | | | |
|---|---|---|---|---|
| 5,762,714 A | * | 6/1998 | Mohn ............... | H01J 37/32623 118/728 |
| 6,044,534 A | * | 4/2000 | Seo .................... | H01L 21/68742 29/25.01 |
| 2003/0075387 A1 | * | 4/2003 | Wang ...................... | C23C 14/50 187/250 |
| 2003/0205329 A1 | * | 11/2003 | Gujer .................. | C23C 16/4586 118/728 |
| 2013/0228323 A1 | * | 9/2013 | Makabe ............ | H01L 21/67109 165/59 |

(Continued)

FOREIGN PATENT DOCUMENTS

JP 2016-146472 A 8/2016

*Primary Examiner* — Charlee J. C. Bennett
(74) *Attorney, Agent, or Firm* — Weihrouch IP

(57) ABSTRACT

A mounting table includes a wafer mounting surface mounting a wafer, a ring mounting surface disposed at a radially outer side of the wafer mounting surface and mounting a first ring having a first engaging portion and a second ring having a second engaging portion to be engaged with the first engaging portion, a lifter pin, and a driving mechanism. The second ring has a through-hole extends to reach a bottom surface of the first engaging portion, and the ring mounting surface has a hole at a position corresponding to the through-hole. A lifter pin has a first holding part that fits into the through-hole and a second holding part that extends from the first holding part and has a part protruding from the first holding part. The lifter pin is accommodated in the hole, and a driving mechanism vertically moves the lifter pin.

17 Claims, 10 Drawing Sheets

(56) References Cited

U.S. PATENT DOCUMENTS

| | | | |
|---|---|---|---|
| 2017/0213758 A1* | 7/2017 | Rice | H01L 21/67017 |
| 2017/0263478 A1* | 9/2017 | McChesney | H01J 37/20 |
| 2018/0308737 A1* | 10/2018 | Moriya | H01L 21/6833 |
| 2020/0020565 A1* | 1/2020 | Rathnasinghe | H01L 21/6835 |
| 2020/0098550 A1* | 3/2020 | Takahashi | H01L 21/67109 |
| 2020/0234981 A1* | 7/2020 | Schmid | H01L 21/67063 |
| 2020/0395195 A1* | 12/2020 | Sanchez | H01J 37/32715 |
| 2021/0098238 A1* | 4/2021 | Hayashi | H01J 37/32715 |
| 2021/0118648 A1* | 4/2021 | Hayashi | H01L 21/67201 |
| 2021/0280396 A1* | 9/2021 | Matsuura | H01L 21/68735 |
| 2022/0013339 A1* | 1/2022 | Dogome | H01L 21/6833 |

\* cited by examiner

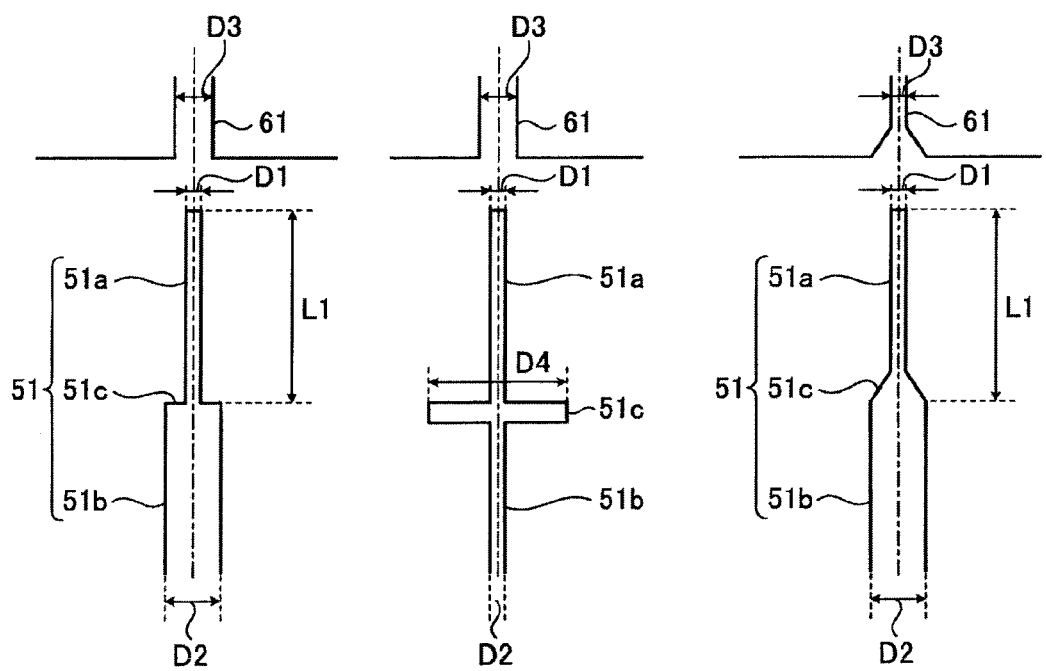

PLASMA PROCESSING APPARATUS AND MOUNTING TABLE THEREOF

CROSS-REFERENCE TO RELATED APPLICATIONS

This application claims priority to Japanese Patent Application No. 2019-001971, filed on Jan. 9, 2019, the entire contents of which are incorporated herein by reference.

TECHNICAL FIELD

The present disclosure relates to a plasma processing apparatus and a mounting table thereof.

BACKGROUND

In a system for processing a substrate such as a semiconductor wafer or the like using plasma, a ring-shaped member may be disposed to surround a radially outer edge of the substrate to adjust an etching rate and/or an etching profile of the plasma.

For example, in a substrate processing system disclosed in Japanese Patent Application Publication No. 2016-146472, an edge connection ring is disposed to surround a radially outer edge of a pedestal in a processing chamber.

The edge connection ring is eroded by the plasma during etching. Therefore, in the Publication, there is employed a configuration in which the edge connecting ring can be lifted using an actuator and exchanged by a robot arm.

The present disclosure provides a technique for easily exchanging consumable components of a plasma processing apparatus.

SUMMARY

In accordance with an aspect of the present disclosure, there is provided a mounting table for a plasma processing apparatus, the mounting table including: a wafer mounting surface; a ring mounting surface that is disposed at a radially outer side of the wafer mounting surface and configured to mount thereon a first ring having a first engaging portion and a second ring having a second engaging portion to be engaged with the first engaging portion, wherein the second ring has a through-hole that extends to reach a bottom surface of the first engaging portion, and the ring mounting surface has a hole at a position corresponding to the through-hole; a lifter pin having a first holding part that fits into the through-hole and a second holding part that extends from the first holding part in an axial direction of the first holding part, wherein the second holding part has a part protruding from an outer periphery of the first holding part, and the lifter pin is configured to be accommodated in the hole of the ring mounting surface with the first holding part facing the ring mounting surface; and a driving mechanism configured to vertically move the lifter pin.

BRIEF DESCRIPTION OF THE DRAWINGS

The objects and features of the present disclosure will become apparent from the following description of embodiments, given in conjunction with the accompanying drawings, in which:

FIGS. 3A to 3C show configuration examples of a lifter pin;

DETAILED DESCRIPTION

A plurality of consumable components is disposed in a plasma processing apparatus. For example, an edge ring is disposed at a radially outer side of a wafer to increase in-plane uniformity of plasma processing on the wafer. In addition, a cover ring is disposed at a radially outer side of the edge ring to protect a mounting table. If a dedicated transfer mechanism is provided for each of the consumable components to exchange the consumable components, the internal structure of the mounting table becomes complicated. Further, a position and a size of a mechanism that can be disposed in the mounting table or below the mounting table are limited due to limited space in the plasma processing apparatus. Therefore, it is preferable to transfer the consumable components disposed in the plasma processing apparatus with a compact configuration.

Hereinafter, embodiments of the present disclosure will be described in detail with reference to the accompanying drawings. The present disclosure is not limited by the following embodiments. The embodiments can be appropriately combined without contradicting processing contents.

Embodiment

Figure 1:
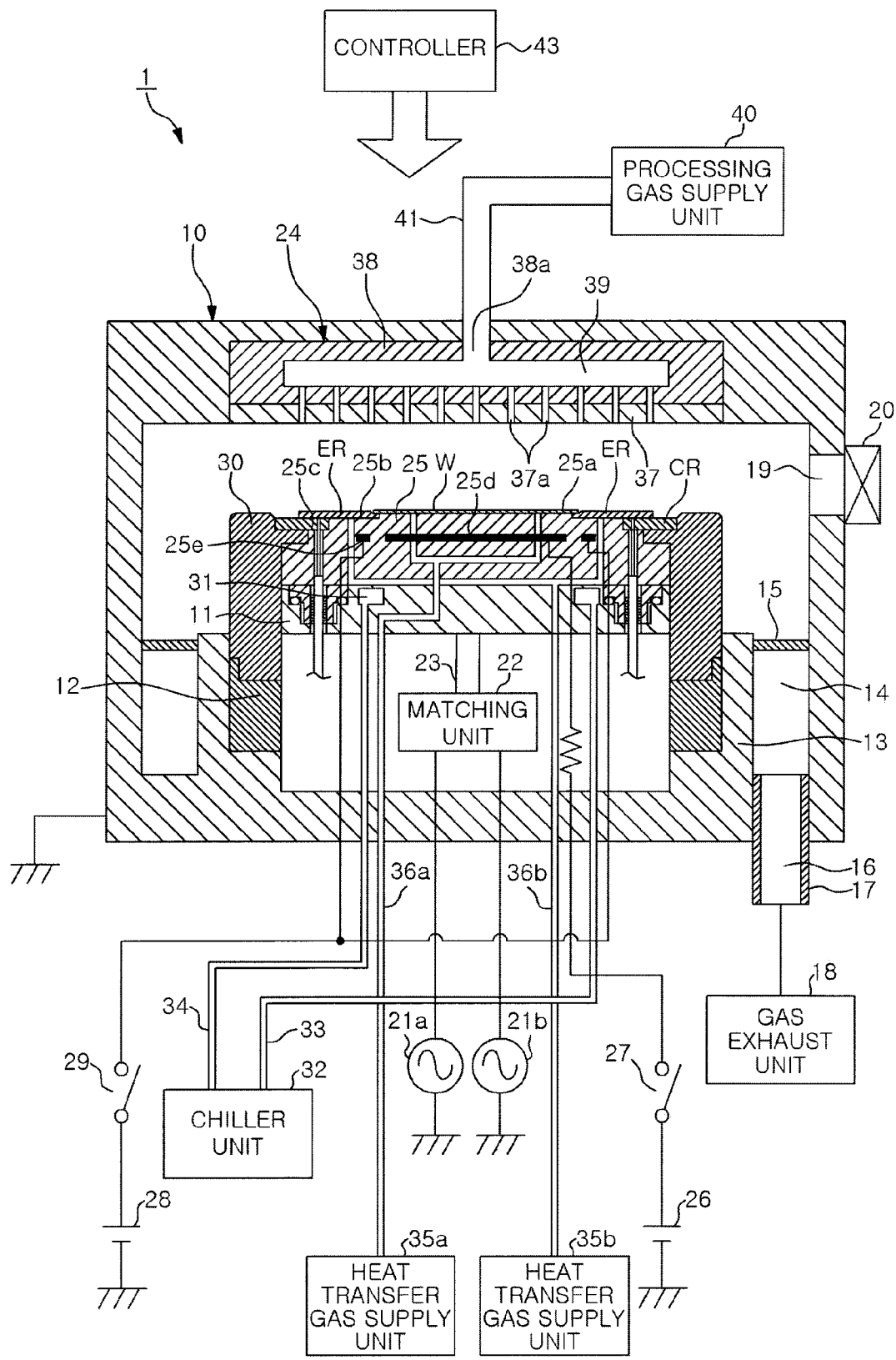
FIG. 1 is a cross-sectional view schematically showing a configuration of a plasma processing apparatus according to an embodiment.

FIG. 1 is a cross-sectional view schematically showing a configuration of a plasma processing apparatus 1 according to an embodiment. The plasma processing apparatus 1 shown in FIG. 1 includes a cylindrical processing chamber 10 made of metal, e.g., aluminum or stainless steel. The processing chamber 10 is frame-grounded. A circular-plate-shaped susceptor (lower electrode) 11 for mounting thereon a wafer W as a target object (substrate) is disposed in the processing chamber 10. The susceptor 11 is made of, e.g., aluminum, and is supported by a cylindrical support 13 extending vertically upward from a bottom portion of the processing chamber 10 via a cylindrical holding member 12 made of an insulator.

A gas exhaust path 14 is formed between a sidewall of the processing chamber 10 and the cylindrical support 13. An annular baffle plate 15 is disposed at an inlet of the gas exhaust path 14 or in the middle of the gas exhaust path 14. A gas exhaust port 16 is disposed at a bottom portion of the processing chamber 10. A gas exhaust unit 18 is connected to the gas exhaust port 16 through a gas exhaust line 17. A gate valve 20 for opening and closing a loading/unloading port 19 for the wafer W is disposed at the sidewall of the processing chamber 10.

A first high frequency power supply 21a and a second high frequency power supply 21b are electrically connected to the susceptor 11 through a matching unit 22 and a power feed rod 23. Here, the first high frequency power supply 21a outputs a first high frequency power having a frequency (usually 40 MHz or higher) that mainly contributes to plasma generation. The first high frequency power supply 21a is an example of a plasma generator. The second high frequency power supply 21b outputs a second high frequency power having a frequency (usually 13.56 MHz or lower) that mainly contributes to attraction of ions to the wafer W on the susceptor 11. The matching unit 22 includes a first matching unit for matching an impedance of the first high frequency power supply 21a and an impedance of a load (mainly the electrodes, the plasma, the processing chamber 10), and a second matching unit for matching an impedance of the second high frequency power supply 21b and the impedance of the load. The voltage that contributes to the ion attraction is not limited to a high frequency voltage, and may be a DC voltage applied in pulses. Although FIG. 1 shows an example in which the first high frequency power 21a and the second high frequency power supply 21b are connected to the susceptor 11, the present disclosure is not limited thereto. The first high frequency power may be connected to a shower head (upper electrode) to be described later, and the second high frequency power may be connected to the susceptor 11.

A shower head 24 serving as an upper electrode having a ground potential, which will be described later, is disposed at a ceiling portion of the processing chamber 10. Accordingly, high frequency voltages from the high frequency power supply 21a and the second high frequency power supply 21b are applied to a space between the susceptor 11 and the shower head 24.

An electrostatic chuck 25 for attracting and holding the wafer W by an electrostatic attractive force is disposed on an upper surface of the susceptor 11. The electrostatic chuck. 25 has a disc-shaped central portion 25a for mounting thereon the wafer W, an annular inner peripheral portion. 25b, and an annular outer peripheral portion 25c. The central portion 25a protrudes upward in the drawing with respect to the inner peripheral portion 25b. The inner peripheral portion 25b protrudes upward in the drawing with respect to the outer peripheral portion 25c. The central portion 25a is an example of a wafer mounting surface for mounting thereon the wafer W. The inner peripheral portion 25b is an example of a ring mounting surface for mounting thereon an edge ring ER. The outer peripheral portion 25c is an example of a ring mounting surface for mounting thereon a cover ring CR. Hereinafter, the structure on which the wafer W is mounted, including the susceptor 11 and the electrostatic chuck 25, is also referred to as "mounting table (wafer support)."

The edge ring ER is a ring-shaped member made of a conductive material, e.g., silicon or the like. The edge ring ER has a function of making plasma distribution on the wafer uniform during the plasma processing and improving the performance of the plasma processing. The cover ring CR is a ring-shaped member made of an insulating material, e.g., quartz or the like. The cover ring CR has a function of protecting the susceptor 11, the electrostatic chuck 25, and the like. An insulating member 30 is disposed at a radially outer side of the cover ring CR to surround and protect the susceptor 11. The edge ring ER is an example of a first ring. The cover ring CR is an example of a second ring. The edge ring ER has a first engaging portion that is overlapped with the cover ring CR. The cover ring CR has a second engaging portion that is overlapped with the first engaging portion of the edge ring ER. The edge ring ER and the cover ring CR will be further described later.

The central portion 25a of the electrostatic chuck 25 is formed by embedding an electrode plate 25d made of a conductive film between dielectric films. The inner peripheral portion 25b is formed by embedding an electrode plate 25e made of a conductive film between dielectric films. A DC power supply 26 is electrically connected to the electrode plate 25d through a switch 27. A DC power supply is electrically connected to the electrode plate 25e through a switch 29. The electrostatic chuck 25 generates an electrostatic attractive force such as a Coulomb force or the like by a voltage applied from the DC power supply 26 to the electrode plate 25d, and the wafer W is attracted to and held on the electrostatic chuck 25 by the electrostatic attractive force. The electrostatic chuck 25 generates an electrostatic attractive force such as a Coulomb force or the like by a voltage applied from the DC power supply 28 to the electrode plate 25e, and the edge ring ER is attracted to and held on the electrostatic chuck 25 by the electrostatic attractive force.

An annular coolant path 31 extending in, e.g., a circumferential direction, is disposed in the susceptor 11. A coolant, e.g., cooling water, of a predetermined temperature supplied from a chiller unit 32 and circulated in the coolant path 31 through lines 33 and 34. A temperature of the wafer W on the electrostatic chuck 25 is controlled by a temperature of the coolant.

A heat transfer gas supply unit 35a is connected to the electrostatic chuck 25 through a wafer side gas supply line 36a. A heat transfer gas supply unit 35b is connected to the electrostatic chuck 25 through a ring side gas supply line 36b. The wafer side gas supply line 36a extends to reach the central portion 25a of the electrostatic chuck 25. The ring side gas supply line 36b extends to reach the inner peripheral portion 25b of the electrostatic chuck 25 common beat transfer gas supply unit may be connected to the wafer side gas supply line 36a and the ring side gas supply line 36b. The heat transfer gas supply unit 35a supplies a heat transfer gas to the space between the central portion 25a of the electrostatic chuck 25 and the wafer W through the wafer side gas supply line 36a. The heat transfer gas supply unit. 35b supplies a heat transfer gas to the space between the inner peripheral portion 25b of the electrostatic chuck 25 and the edge ring ER through the ring side gas supply line 36b. A thermally conductive gas, e.g., He gas or the like, is suitable for the heat transfer gas.

The shower head 24 disposed at the ceiling portion includes an electrode plate 37 as a bottom surface thereof having a plurality of gas injection holes 37a and an electrode holder 38 detachably holding the electrode plate 37. A buffer space 39 is provided in the electrode holder 38. A gas supply line 41 from a processing gas supply unit 40 is connected to a gas inlet port 38a of the buffer space 39.

The respective components of the plasma processing apparatus, such as the exhaust unit 18, the high frequency power supplies 21a and 21b, the switches 27 and 29 for the electrostatic chuck, the DC power supplies 26 and 28, the chiller unit 32, the heat transfer gas supply units 35a and 35b, the processing gas supply unit 40, and the like are connected to and controlled by a controller 43.

The controller 43 includes a central processing unit (CPU) (not shown) and a storage device such as a memory. The controller 43 reads out and executes a program and a processing recipe stored in the storage device to perform a desired processing in the plasma processing apparatus.

The controller 43 is connected to a transfer mechanism (see FIG. 2) to be described below. The controller 43 controls the transfer mechanism 50 to transfer the edge ring ER and the cover ring CR.

(Example of the Transfer Mechanism 50)

Figure 2:
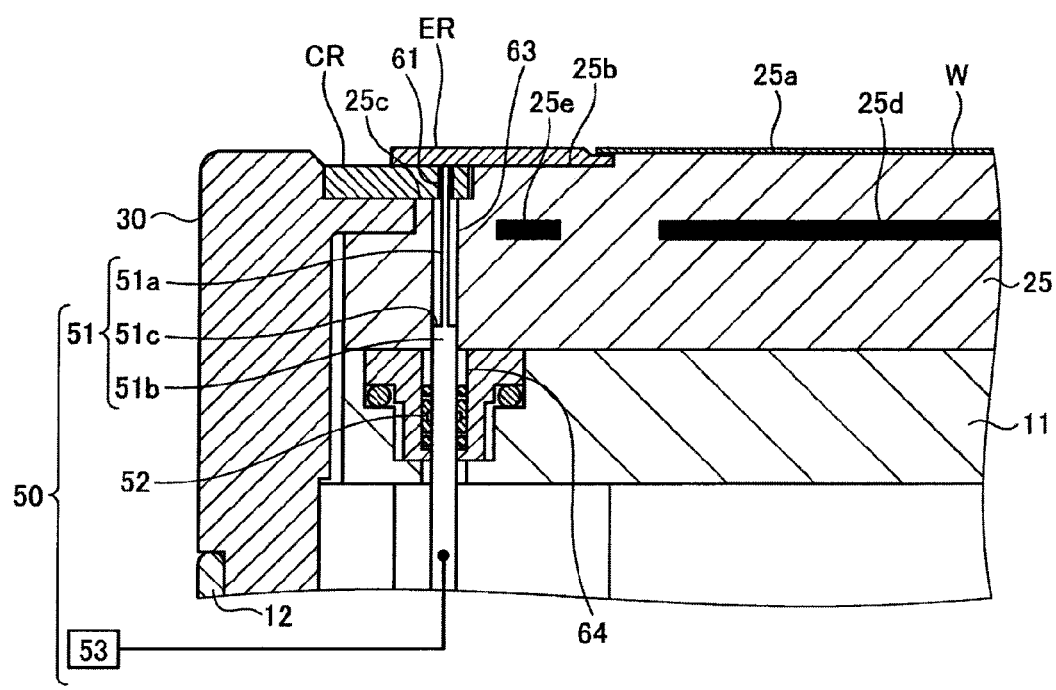
FIG. 2 is a cross-sectional view schematically showing a configuration of a transfer mechanism according to the embodiment.

FIG. 2 is a cross-sectional view schematically showing a configuration of the transfer mechanism 50 according to the embodiment. The plasma processing apparatus according to the embodiment includes the transfer mechanism 50 for transferring the edge ring ER and the cover ring CR mounted on the mounting table. The transfer mechanism 50 includes a lifter pin 51, a sealing member 52, and a driving mechanism 53.

In the example of FIG. 2, the wafer W is mounted on the central portion 25a of the electrostatic chuck 25, and the edge ring ER is mounted on the inner peripheral portion 25b. The cover ring CR is mounted on the outer peripheral portion 25c. When the wafer W, the edge ring ER and the cover ring CR are placed in correct positions on the mounting table, an outer peripheral portion of the edge ring ER covers an inner peripheral portion of the cover ring CR from above. Therefore, the inner peripheral portion of the cover ring CR is not exposed to a plasma processing space. A through-hole 61 extending through the cover ring CR in a vertical direction is formed at the inner peripheral portion of the cover ring CR covered with the edge ring ER. The outer peripheral portion of the edge ring ER is an example of the first engaging portion, and the inner peripheral portion of the cover ring CR is an example of the second engaging portion. Although it is not illustrated in FIG. 2, a positioning structure may be disposed at a portion where the inner peripheral portion of the cover ring CR and the outer peripheral portion of the edge ring ER are in contact with each other. For example, a recess formed at a bottom surface of the edge ring ER and a protrusion formed at an upper surface of the cover ring CR may be engaged. Further, the through-hole 61 of the cover ring CR may be formed at the positioning structure. For example, the through-hole 61 may be formed at a portion passing through the protrusion of the cover ring CR.

A hole 63 is formed at the ring mounting surface of the outer peripheral portion 25c of the electrostatic chuck 25 to positionally correspond to the through-hole 61. A hole 64 is formed in the susceptor 11 to communicate with the hole 63.

The lifter pin 51 is accommodated in the holes 63 and 64 and is connected to the driving mechanism 53 at the lower end thereof. Hereinafter, the end of the lifter pin 51 connected to the driving mechanism 53 is referred to as "base end" and the opposite end thereof is referred to as "distal end (or top end)." The sealing member 52 is disposed in the hole 64. The lifter pin 51 extends downward through the sealing member 52. The sealing member 52 prevents communication between a space above and a space below the sealing member 52 in the holes 63 and 64. The sealing member 52 is, e.g., a shaft seal, a bellows or the like.

The driving mechanism 53 vertically moves the lifter pin 51. The type of the driving mechanism 53 is not particularly limited, and may be, e.g., a piezo actuator, a motor, or the like.

The lifter pin 51 has a first holding part 51a, a second holding part 51b, and a protruding part 51c. The first holding part 51a has a predetermined length L1 (see FIGS. 3A to 3C and FIG. 6) from the distal end of the lifter pin 51. The first holding part 51a has a cross section that allows the first holding part 51a to fit into the through-hole 61 formed at the inner peripheral portion of the cover ring CR with a predetermined clearance. The second holding part 51b extends in an axial direction of the first holding part 51a from the base end of the first holding part 51a. The second holding part 51b has, at an axial position where the second holding part 51b extends from the first holding part 51a, the protruding part 51c that protrudes outward from an outer periphery of the first holding part. The cross section of the second holding part 51b where the protruding part 51c is formed has a size or a shape that does not allow the second holding part 51b to fit into the through-hole 61. In other words, when the lifter pin 51 is inserted into the through-hole 61 from the bottom surface side of the cover ring CR, the first holding part 51a penetrates through the through-hole 61. Then, the protruding part 51c is brought into contact with the bottom surface of the cover ring CR. The second holding part 51b is caught at the entrance of the through-hole 61 by the protruding part 51c, supporting the cover ring CR from the bottom surface.

Specific shapes of the first holding part 51a, the second holding part 51b, and the protruding part 51c are not particularly limited. For example, the first holding part 51a and the second holding part 51b may be coaxial rod-shaped members that have concentric cross sections. FIGS. 3A to 3C show configuration examples of the lifter pin 51. In the example of FIG. 3A, a diameter D1 of the first holding part 51a is smaller than a diameter D2 of the second holding part 51b. The protruding part 51c protrudes radially outward as the diameter of the cylindrical lifter pin 51 increases from the diameter D1 to the diameter D2 at the distal end of the second holding part 51b. In the example of FIG. 3A, the through-hole 61 of the cover ring CR has a diameter greater than the diameter D1 of the first holding part 51a. On the other hand, the diameter of the through-hole 61 of the cover ring CR is smaller than the diameter D2 of the second holding part 51b.

In the example of FIG. 3B, the diameter D1 of the first holding part 51a is substantially equal to the diameter D2 of the second holding part 51b. The protruding part 51c is a flange that protrudes radially outward at the distal end of the second holding part 51b. At the protruding part 51c, the second holding part 51b has a diameter D4 that is greater than the diameters D1 and D2. A diameter D3 of the through-hole 61 of the cover ring CR is greater than the diameters D1 and D2 and smaller than the diameter D4.

The first holding part 51a and the second holding part 51b may have polygonal cross sections. The cross-sectional area of the first holding part 51a is not necessarily smaller than that of the second holding part 51b. It is acceptable as long as the protruding part 51c protruding outward is formed at least at the distal end of the second holding part 51b. For example, as in the example of FIG. 3B, the first holding part 51a and the second holding part 51b may be formed in cylindrical shapes having the same cross-sectional area, and a flange serving as the protruding part 51c may be formed at the distal end of the second holding part 51b. Further, the hole 63 of the electrostatic chuck and the hole 64 of the susceptor 11 have sizes, respectively, that allow the lifter pin 51 to be accommodated therein. For example, when the lifter pin 51 is formed in a cylindrical shape, the holes 63 and 64 are formed as cylindrical spaces into which the second holding part 51b is fit with a predetermined clearance. In order to stabilize the positional relationship between the protruding part 51c and the bottom surface of the cover ring CR, a lower opening of the through-hole 61 may be widened downward. In this case, the protruding part 51c has a shape to be in contact with the lower opening of the through-hole 61. For example, the protruding part 51c may be formed as an inclined part whose cross-sectional area is gradually increased from the first holding part 51a toward the second holding part 51b (see the example of FIG. 3C).

(Example of transfer of the edge ring ER)

Figure 4A:
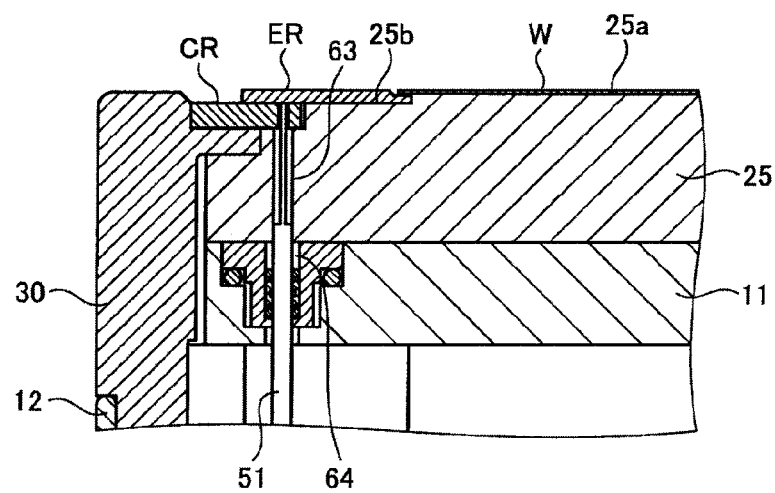
FIG. 4A shows an example of a state in which a transfer of an edge ring is started by a transfer mechanism according to the embodiment.

Next, a transfer of the edge ring ER using the transfer mechanism 50 according to the embodiment will be described with reference to FIGS. 4A to 4E. FIG. 4A shows an example of a state in which the transfer of the edge ring ER using the transfer mechanism 50 according to the embodiment is started.

As shown in FIG. 4A, the lifter pin 51 is accommodated in the holes 63 and 64 except during the transfer operation. In the example of FIG. 4A, the distal end of the lifter pin 51 is inserted into the through-hole 61 of the cover ring CR and is in contact with the edge ring ER. However, the distal end of the lifter pin 51 may be accommodated below the cover ring CR.

Figure 4B:
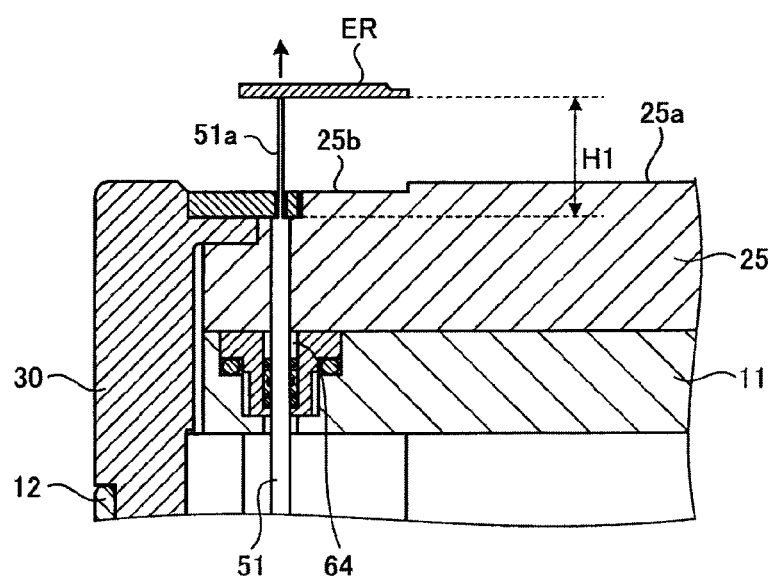
FIG. 4B shows an example of a state in which the edge ring is lifted by the transfer mechanism according to the embodiment.

FIG. 4B shows an example of a state in which the edge ring ER is lifted by the transfer mechanism 50 according to the embodiment. In the case of transferring the edge ring ER, the driving mechanism 53 first lifts the lifter pin 51 upward. When the lifter pin 51 is lifted, the first holding part 51a penetrates through the through-hole 61 of the cover ring CR and is brought into contact with the bottom surface of the edge ring ER. When the lifter pin 51 is further lifted, the edge ring ER is lifted upward by the lifter pin 51 and separated from the inner peripheral portion 25b of the electrostatic chuck 25. The driving mechanism 53 lifts the distal end of the lifter pin 51 to a preset first transfer height H1. The first transfer height H1 will be further described later.

Figure 4C:
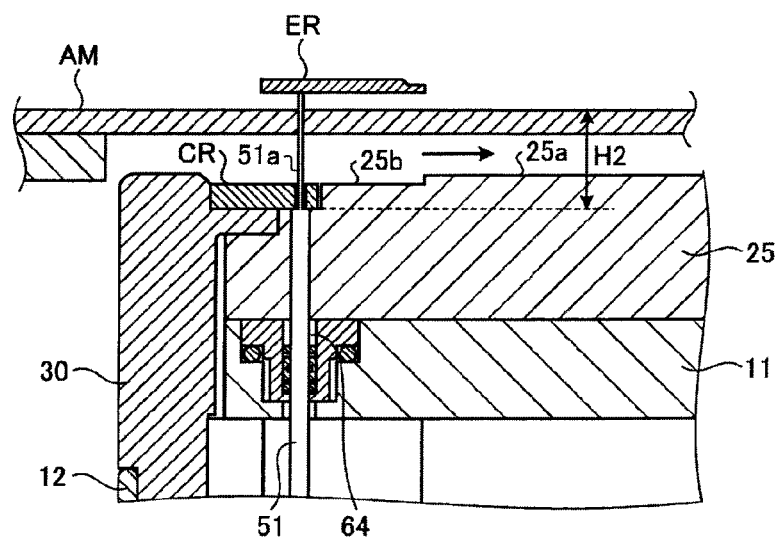
FIG. 4C shows an example of a state immediately before the edge ring lifted by the transfer mechanism according to the embodiment is mounted on a transfer robot arm.

FIG. 4C shows an example of a state immediately before the edge ring ER lifted by the transfer mechanism 50 according to the embodiment is mounted on a transfer robot arm AM. After the edge ring ER is lifted to the first transfer height H1 by the lifter pin 51, the controller 43 controls the transfer robot arm AM to move to a position above the susceptor 11 from the outside of the processing chamber 10. The transfer robot arm AM moves in a horizontal direction in a state where an upper surface thereof is located at a height H2 lower the first transfer height H1. When the transfer robot arm AM is disposed below the edge ring ER lifted by the lifter pin 51, the driving mechanism 53 starts to lower the lifter pin 51. When the lifter pin 51 is lowered, the edge ring ER held on the lifter pin 51 is mounted on the upper surface of the transfer robot arm AM.

Figure 4D:
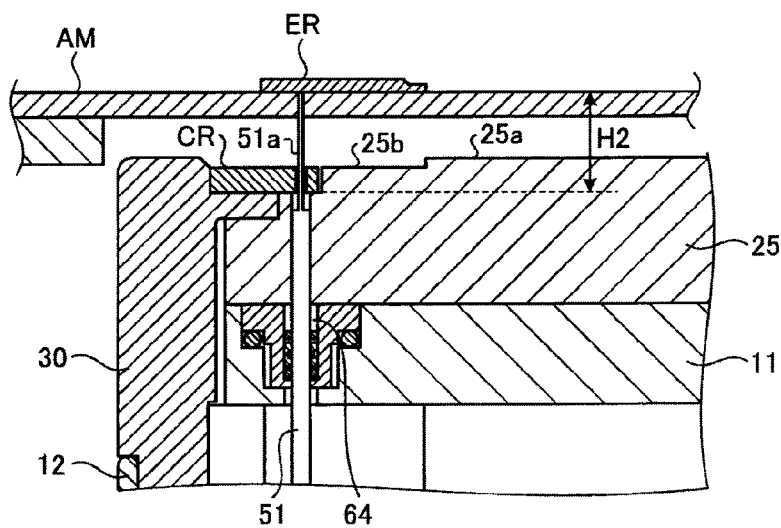
FIG. 4D shows an example of a state in which the edge ring lifted by the transfer mechanism according to the embodiment is mounted on the transfer robot arm.

FIG. 4D shows an example of a state in which the edge ring ER lifted by the transfer mechanism 50 according to the embodiment is mounted on the transfer robot arm AM. After the edge ring ER is mounted on the transfer robot arm AM, the lifter pin 51 continues to move downward to a position lower than the height H2. When the lifter pin 51 is accommodated in the holes 63 and 64, the controller 43 controls the transfer robot arm AM on which the edge ring ER is mounted to move to the outside of the processing chamber 10.

Figure 4E:
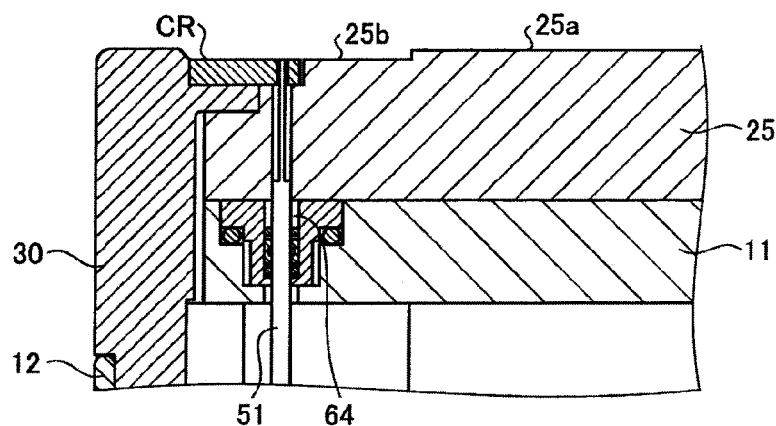
FIG. 4E shows an example of a state in which the transfer of the edge ring using the transfer mechanism according to the embodiment is completed.

FIG. 4E shows an example of a state in which the transfer of the edge ring ER using the transfer mechanism 50 according to the embodiment is completed. The transfer robot arm AM moves the edge ring ER to the outside of the processing chamber 10, and the lifter pin 51 is retracted to the position before the transfer is started. Then, the transfer of the edge ring ER is completed.

(Example of transfer of the cover ring CR)

Figure 5A:
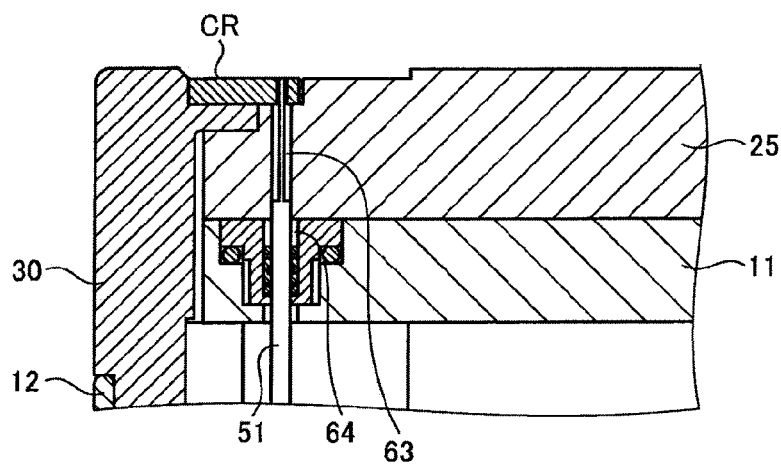
FIG. 5A shows an example of a state in which a transfer of a cover ring is started by the transfer mechanism according to the embodiment.

Next, a transfer of the cover ring CR using the transfer mechanism 50 according to the embodiment will be described with reference to FIGS. 5A to 5E. FIG. 5A shows an example of a state in which the transfer of the cover ring CR using the transfer mechanism 50 according to the embodiment is started.

As shown in FIG. 5A, the cover ring CR is unloaded in a state where the edge ring ER is not disposed on the cover ring CR. The position of the lifter pin 51 is the same as that at the time of starting the transfer of the edge ring ER.

Figure 5B:
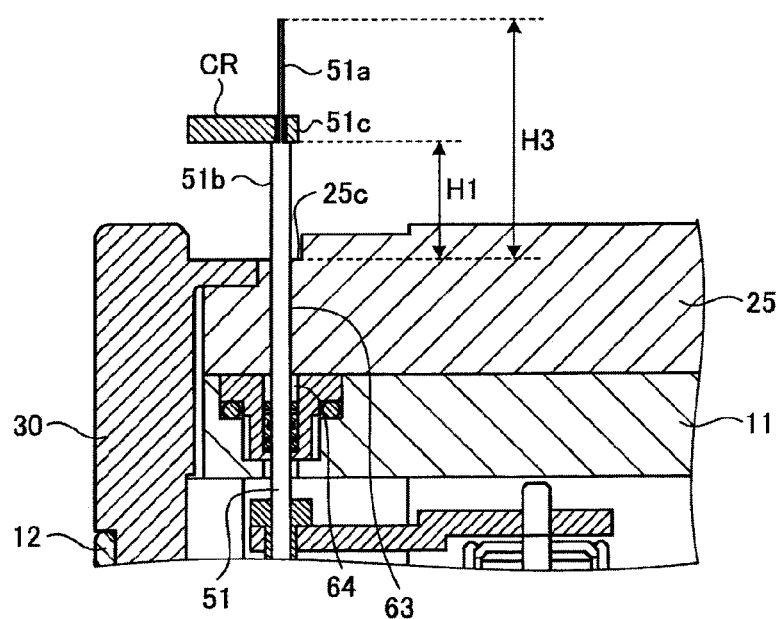
FIG. 5B shows an example of a state in which the cover ring is lifted by the transfer mechanism according to the embodiment.

FIG. 5B shows an example of a state in which the cover ring CR is lifted by the transfer mechanism 50 according to the embodiment. Unlike the transfer of the edge ring ER, the driving mechanism 53 lifts the distal end of the lifter pin 51 to a second transfer height H3 in the case of transferring the cover ring CR. When the driving mechanism lifts the lifter pin 51 by the length of the first holding part 51a, the protruding part 51c formed at the distal end of the second holding part 51b of the lifter pin 51 is brought into contact with the bottom surface of the cover ring CR. When the lifter pin 51 is further lifted in a state where the protruding part 51c is in contact with the bottom surface of the cover ring CR, the cover ring CR is separated from the outer peripheral portion 25c of the electrostatic chuck 25 and lifted upward. The driving mechanism 53 continuously lifts the distal end of the lifter pin 51 to the second transfer height H3. As a result, the distal end of the second holding part 51b, i.e., the bottom surface of the cover ring CR, is lifted to the first transfer height H1.

Figure 5C:
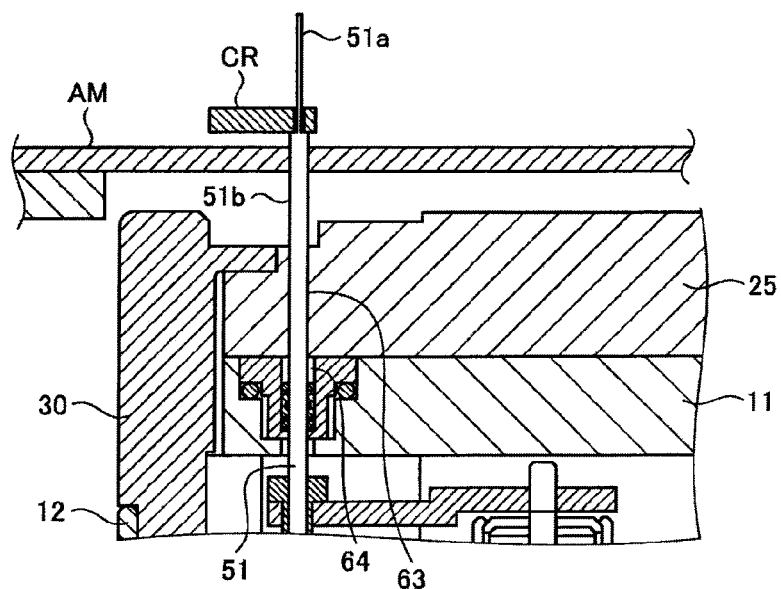
FIG. 5C shows an example of a state immediately before the cover ring lifted by the transfer mechanism according to the embodiment is mounted on the transfer robot arm.

FIG. 5C shows an example of a state immediately before the cover ring CR lifted by the transfer mechanism 50 according to the embodiment is mounted on the transfer robot arm AM. After the cover ring CR is lifted to the first transfer height H1 by the lifter pin 51, the controller 43 controls the transfer robot arm AM to move to a position above the susceptor 11 from the outside of the processing chamber 10. The transfer robot arm AM moves in the horizontal direction in a state where the upper surface thereof is located at the height H2 lower than the first transfer height H1. When the transfer robot arm AM is disposed below the cover ring CR lifted by the lifter pin 51, the driving mechanism 53 starts to lower the lifter pin 51. When the lifter pin 51 is lowered and the protruding part 51c formed at the distal end of the second holding part 51b reaches the height H2, the cover ring CR held on the lifter pin 51 is mounted on the transfer robot arm AM.

Figure 5D:
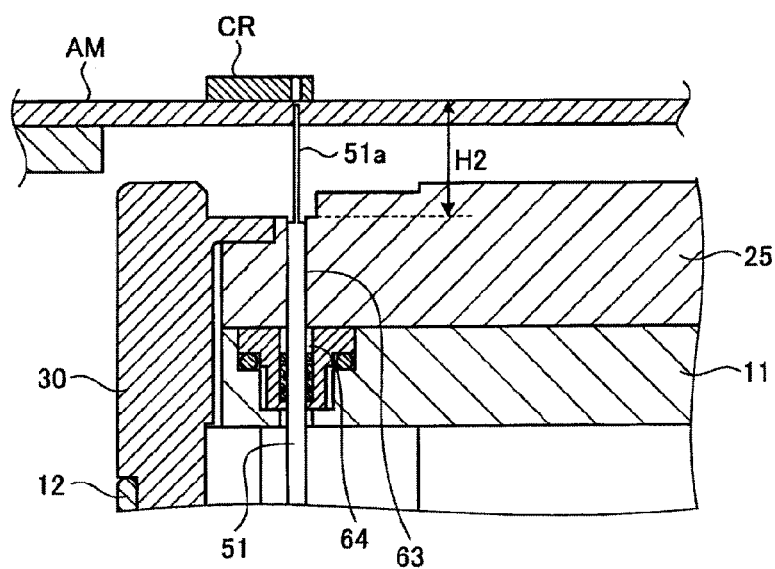
FIG. 5D shows an example of a state in which the cover ring lifted by the transfer mechanism according to the embodiment is mounted on the transfer robot arm.

FIG. 5D shows an example of a state in which the cover ring CR lifted by the transfer mechanism 50 according to the embodiment is mounted on the transfer robot arm AM. After the cover ring CR is mounted on the transfer robot arm, the lifter pin 51 is further lowered, and the protruding part 51c moves to a position lower than the height H2. As the lifter pin 51 is lowered, the first holding part 51a penetrates through the through-hole 61. When the lifter pin 51 is accommodated in the holes 63 and 64, the controller 43 controls the transfer robot arm AM on which the cover ring CR is mounted to the outside of the processing chamber 10.

Figure 5E:
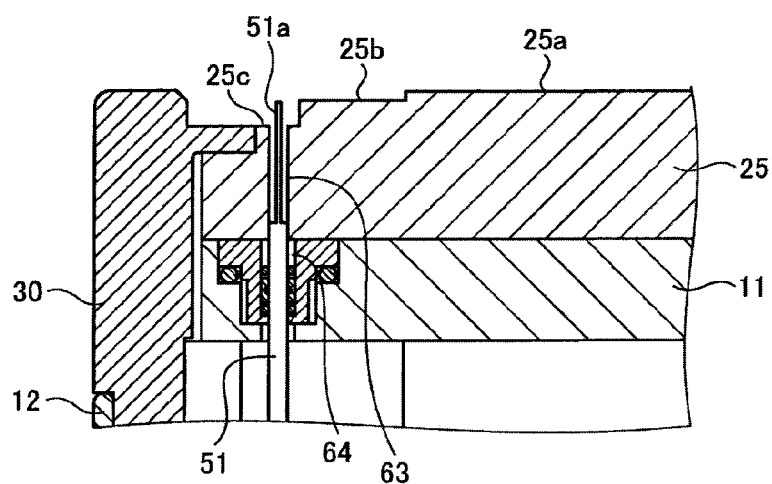
FIG. 5E shows an example of a state in which the transfer of the cover ring using the transfer mechanism according to the embodiment is completed.

FIG. 5E shows an example of a state in which the transfer of the cover ring CR using the transfer mechanism 50 according to the embodiment is completed. The transfer robot arm AM moves the cover ring CR to the outside of the processing chamber 10, and the lifter pin 51 is retracted to the position before the transfer is started. Then, the transfer of the cover ring CR is completed.

As described above, the transfer mechanism 50 according to the embodiment transfers both of the edge ring ER and the cover ring CR using the same lifter pin 51 by setting the lifting amount of the lifter pin 51 for the transfer of the edge ring ER to be different from that for the transfer of the cover ring CR. Therefore, the lifter pin 51 includes the first holding part 51a and the second holding part 51b having the protruding part 51c at an axial position where the second holding part 51b extends from the first holding part 51a. In addition, the cover ring CR has the through-hole 63 at a position where the edge ring ER and the cover ring CR are overlapped with each other.

Figures 6A, 6B, 6C:
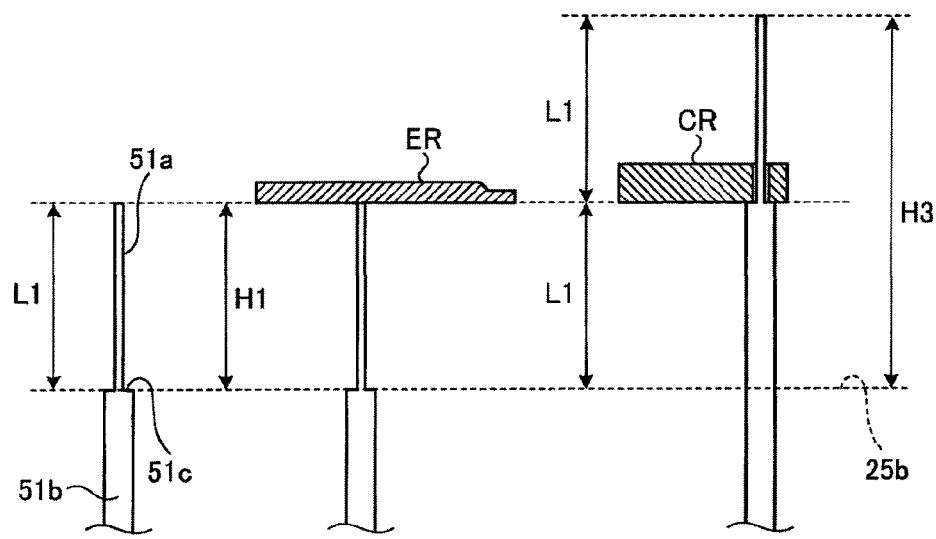
FIGS. 6A to 6C explain the relationship among a length of a first holding part of the lifter pin, a first transfer height, and a second transfer height.

FIGS. 6A to 6C explain the relationship among the length L1 of the first holding part 51a of the lifter pin 51, the first transfer height H1, and the second transfer height H3. In FIGS. 6A to 6C, the first transfer height H1 and the second transfer height H3 will be described using the upper surface of the outer peripheral portion 25c of the electrostatic chuck 25 as a reference surface. First, the length L1 of the first holding part 51a is set to be substantially the same as the first transfer height H1 (FIG. 6A). The second transfer height H3 is approximately twice the first transfer height H1. In the case of transferring the edge ring ER, the driving mechanism 53 lifts the distal end of the lifter pin 51 to the first transfer height H1 (FIG. 6B). In the case of transferring the cover ring CR, the distal end of the lifter pin 51 is lifted to the second transfer height H3 (FIG. 6C). In the examples of FIGS. 6A to 6C, the length L1 of the first holding part 51a is set to be equal to the first transfer height H1 in order to allow the transfer robot arm AM to perform the same control by lifting the edge ring ER and the cover ring CR to the same height during the transfer operation. Further, the second transfer height H3 is set to be approximately twice the first transfer height.

By setting the lifting amount during the transfer operation and the size of each part of the lifter pin 51 as described above, the edge ring ER and the cover ring CR can be lifted to the same height (first transfer height H1) during the transfer operation. Therefore, different consumable components can be transferred without changing the height of the transfer robot arm AM. However, the lifting amount during the transfer operation and the size of each part of the lifter pin 51 are not limited thereto. The lifting amount during the transfer operation and the size of each part of the lifter pin 51 can be adjusted depending on the sizes of the components disposed on the mounting table or the performance of the transfer robot arm AM. In accordance with the configuration of the embodiment, a plurality of consumable components can be easily transferred by one transfer mechanism 50.

(Consumable components to be transferred)

In the above-described embodiment, the transfer mechanism 50 transfers the cover ring CR and the edge ring ER. However, the transfer mechanism 50 according to the embodiment may further transfer multiple parts of any consumable component or a plurality of consumable components.

For example, the edge ring ER is divided into two parts, i.e., an inner peripheral part and an outer peripheral part, and a quickly consumed part between the two parts partially overlaps a slowly consumed part. At a portion where the inner peripheral part and the outer peripheral part overlap each other, a through-hole is formed in the slowly consumed part positioned at a lower side. The first holding part 51a of the lifter pin 51 has a size that allows the first holding part 51a to be inserted into the through-hole. The protruding part 51c has a shape and/or a size that does not allow the protruding part 51c to be inserted into the through-hole. With this configuration, it is possible to realize the independent exchange of the quickly consumed part (part positioned at the upper side) and also the transfer of another part (parts positioned at the lower side) using the same transfer mechanism 50.

Three or more components may be transferred by one transfer mechanism. For example, the edge ring ER is divided into the inner peripheral part and the outer peripheral part, and the cover ring CR is disposed at a radially outer side of the edge ring ER. Then, the inner peripheral part, the outer peripheral part, and the cover ring are at least partially overlapped with one another in a vertical direction in the position where the outer peripheral part is disposed. Then, through-holes having different cross-sectional areas are formed in two consumable components disposed at the lower side. The through-hole formed in the consumable component disposed at the lowermost side has a largest cross-sectional area.

The lifter pin 51 is provided with three or more holders having cross-sectional areas or protruding parts corresponding to the through-holes formed in the consumable components. For example, a third holding part extending from the base end of the second holding part 51b is provided, in addition to the first holding part 51a and the second holding part 51b, and an additional protrusion that is the same as the protruding part 51c is formed at the distal end of the third holding part. By allowing the protruding part 51c and the additional protrusion to have shapes respectively corresponding to the through-holes of the consumable components, three or more consumable components can be vertically moved by one transfer mechanism.

(Modification of Configuration in Response to Degree of Consumption)

In the above-described embodiment, the cover ring CR is disposed below the edge ring ER. However, when the consumable component disposed at the outer side is quickly consumed, the inner peripheral portion of the consumable component disposed at the outer side may be disposed and overlapped on the outer peripheral portion of the consumable component disposed at the inner side.

(Modification of Configuration of Transfer Mechanism)

In the above-described embodiment, the number of the lifter pin 51 is not particularly limited. By providing two or more lifter pins 51, preferably three or more lifter pins 51, the edge ring ER and the cover ring CR can be vertically moved. One driving mechanism 53 may be provided for each lifter pin 51, or one driving mechanism 53 may be shared by a plurality of lifter pins 51.

In the above-described embodiment, in order to prevent discharge from occurring or becoming intense in the holes 63 and 64 formed in the electrostatic chuck 25 and the susceptor 11, the inside of the holes 63 and 64 and the mounting table are set to have the same potential. For example, the surroundings of the holes are made of the same metal as that forming the other parts of the mounting table.

(Effects of the Embodiment)

As described above, the plasma processing apparatus according to the embodiment include the mounting table having the wafer mounting surface for mounting thereon the wafer. The mounting table according to the embodiment includes the ring mounting surface for mounting thereon the first ring having the first engaging portion and the second ring having the second engaging portion to be engaged with the first engaging portion. The second ring has a through-hole that extends to reach the bottom surface of the first engaging portion. The ring mounting surface has the hole at the position corresponding to the through-hole and is disposed at the radially outer side of the wafer mounting surface. The mounting table according to the embodiment further includes the lifter pin having the first holding part that fits into the through-hole, and the second holding part that extends from the first holding part in the axial direction of the first holding part and has the protruding part protruding from the outer periphery of the first holding part. The lifter pin is configured to be accommodated in the hole of the ring mounting surface with the first holding part facing the ring mounting surface. The mounting table according to the embodiment further includes the driving mechanism for vertically moving the lifter pin.

As described above, in the mounting table according to the embodiment, the lifter pin can be brought into contact with the first ring by lifting the lifter pin through the hole of the ring mounting surface and the through-hole of the second ring using the driving mechanism. Therefore, in the mounting table according to the embodiment, the first ring can be lifted and transferred from the ring mounting surface in a state where the second ring is mounted on the ring mounting surface. Further, in the mounting table according to the embodiment, the lifter pin can be lifted by the driving mechanism to bring the protruding part of the second holding part into contact with the bottom surface of the second ring. Accordingly, in the mounting table according to the embodiment, both of the first ring and the second ring can be transferred using one lifter pin. In the mounting table according to the embodiment, a plurality of consumable components is transferred using one lifter pin, so that the space occupied by the transfer mechanism can be reduced.

Further, in the mounting table according to the embodiment, the first holding part and the second holding part may be coaxial rod-shaped members that have concentric cross sections, and the diameter of the first holding part may be smaller than that of the second holding part. Since the first holding part and the second holding part are concentric rod-shaped members, the lifter pin can be easily processed and manufactured.

Further, in the mounting table according to the embodiment, the first ring may be disposed closer to the center of the wafer mounting surface than the second ring, and the second engaging portion may be disposed closer to the ring mounting surface than the first engaging portion. For example, the first ring (edge ring) and the second ring (cover ring) are sequentially arranged toward the radially outer side of the wafer. The first engaging portion of the first ring disposed at the inner side (the outer peripheral side of the edge ring) is positioned above the second engaging portion of the second ring disposed at the outer side (the inner peripheral side of the cover ring). Therefore, in accordance with the embodiment, the first ring disposed closer to the wafer can be easily transferred without moving the second ring.

Further, in the mounting table according to the embodiment, the first ring may be made of a conductive material, and the second ring may be made of an insulating material. Therefore, in accordance with the embodiment, the first ring can be easily transferred and exchanged without moving the second ring, which makes it possible to stabilize the quality of the plasma processing. The first ring may be made of, e.g., silicon, silicon carbide (SiC), or the same material as that forming a mask on the wafer.

Further, in the mounting table according to the embodiment, the second ring may be disposed closer to the center of the wafer mounting surface than the first ring, and the second engaging portion may be disposed closer to the ring mounting surface than the first engaging portion. As described above, the mounting table according to the embodiment is applicable for a plurality of consumable components disposed at various positions and having different degrees of consumption.

The mounting table according to the embodiment may further include the electrostatic chuck for attracting and holding at least one of the first ring and the second ring on the ring mounting surface. The mounting table according to the embodiment may further include the gas supply unit for supplying a heat transfer gas to the gap between the ring mounting surface and the bottom surface of at least one of the first ring and the second ring. Therefore, in the mounting table according to the embodiment, heat of the components on the mounting table such as the first ring, the second ring, and the like can be easily released to a lower structure. Accordingly, in accordance with the embodiment, there is no need to interpose a structure such as a heat transfer sheet or the like among the first ring, the second ring and the mounting table. Hence, in accordance with the embodiment, the first ring and the second ring can be easily transferred by the lifter pin having a simple structure.

Further, in the mounting table according to the embodiment, the driving mechanism may lift the lifter pin until the top end of the first holding part reaches the transfer height during the transfer of the first ring. The driving mechanism may further lift the lifter pin until the top end of the second holding part reaches the transfer height during the transfer of the second ring. As described above, in accordance with the embodiment, it is possible to easily transfer a plurality of components using one lifter pin by switching the driving mode of the lifter pin depending on whether the transfer object is the first ring or the second ring.

Further, in the mounting table according to the embodiment, the axial length of the first holding part of the lifter pin may be greater than the axial thickness of the second ring. Since the first holding part is at least thicker than the second ring, both of the first ring and the second ring can be vertically moved by one lifter pin.

The embodiments of the present disclosure are illustrative in all respects and are not restrictive. The above-described embodiments can be embodied in various forms. Further, the above-described embodiments may be omitted, remounted, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing apparatus comprising:
a plasma processing chamber;
a susceptor disposed in the plasma processing chamber, the susceptor having a hole;
an electrostatic chuck disposed on the susceptor, the electrostatic chuck having a substrate placing face and a ring placing face surrounding the substrate placing face;
a first ring having an inner peripheral portion positioned on the ring placing face;
a second ring having an upper face that supports an outer peripheral portion of the first ring, the second ring having an inner peripheral portion having a through hole extending to a bottom of the first ring, the through hole aligning with the hole of the susceptor;
the second ring having: (a) an inner diameter which is larger than an inner diameter of the first ring, and (b) an outer diameter which is larger than an outer diameter of the first ring;
a lifter pin having a first holding segment engaging with the through hole, and a second holding segment having a protrusion that upwardly protrudes from the first holding segment, the lifter pin being housed in the hole of the susceptor;
a driving mechanism configured to vertically move the lifter pin, wherein:
the apparatus includes a mounting table which includes the susceptor and the electrostatic chuck, and
the ring placing face is provided on the electrostatic chuck such that the inner peripheral portion of the first ring is on the electrostatic chuck, and
the plasma processing apparatus further includes an insulating member, the insulating member having an outer diameter larger than the outer diameter of the second ring, and wherein a portion of the insulating member is below the second ring such that the outer peripheral portion of the second ring covers the portion of the insulating member while the inner peripheral portion of the second ring is covered by the first ring.

2. A plasma processing apparatus comprising:
a plasma processing chamber;
a mounting table having a substrate placing face for placing a substrate, and a ring placing face surrounding the substrate placing face, the mounting table further including at least three holes providing openings in the mounting table;
a first ring having an inner peripheral portion and an outer peripheral portion, the inner peripheral portion of the first ring positioned on the ring placing face;
a second ring having an inner peripheral portion and an outer peripheral portion, an upper face of the inner peripheral portion of the second ring being covered by a lower face of the outer peripheral portion of the first ring, the inner peripheral portion of the second ring having at least three through holes that align with respective holes of the at least three holes of the mounting table;
the second ring having: (a) an inner diameter which is larger than an inner diameter of the first ring, and (b) an outer diameter which is larger than an outer diameter of the first ring;
at least three lifter pins each housed in a respective one of the at least three holes of the mounting table, each lifter pin having a first holding segment extending through a corresponding through hole of the at least three through holes of the second ring and supporting the first ring at the lower face of the first ring, and a second holding segment having a larger outer dimension than the first holding segment and supporting the second ring at a lower face of the second ring; and
a driving mechanism configured to vertically move the at least three lifter pins, wherein: the mounting table includes a susceptor and an electrostatic chuck, the at least three holes of the mounting table extending in the susceptor, and wherein the electrostatic chuck is above the susceptor, and
the ring placing face is provided on the electrostatic chuck such that the inner peripheral portion of the first ring is on the electrostatic chuck,
the plasma processing apparatus further including an insulating member, the insulating member having an outer diameter larger than the outer diameter of the second ring, and wherein a portion of the insulating member is below the second ring such that the outer peripheral portion of the second ring covers the portion of the insulating member while the inner peripheral portion of the second ring is covered by the first ring.

3. The plasma processing apparatus of claim 2, wherein the first ring is formed of a conductive material and the second ring is formed of an insulating material.

4. The plasma processing apparatus of claim 2, wherein the first ring is formed of a material which includes silicon or silicon carbide.

5. The plasma processing apparatus of claim 1, wherein the protrusion includes an inclined part having a cross-sectional area which gradually increases in a direction away from the first holding segment.

6. The plasma processing apparatus of claim 2, wherein the ring placing face has an inner peripheral portion and an outer peripheral portion, the inner peripheral portion of the first ring being placed on the inner peripheral portion of the ring placing face.

7. The plasma processing apparatus of claim 2, wherein the insulating member surrounds the mounting table and supports an outer peripheral portion of the second ring.

8. The plasma processing apparatus of claim 7, wherein an upper face of the mounting table includes the substrate placing face having a first height, and the ring placing face having a second height.

9. The plasma processing apparatus of claim 2, wherein the electrostatic chuck attracts the first ring on the ring placing face.

10. The plasma processing apparatus of claim 2, wherein the first ring is made of silicon or silicon carbide, and the second ring is made of quartz.

11. The plasma processing apparatus of claim 2, wherein a recess is formed at a bottom surface of the outer peripheral portion of the first ring, and a protrusion is formed at an upper surface of the inner peripheral portion of the second ring, the protrusion being engaged with the recess.

12. The plasma processing apparatus of claim 2, wherein the first ring is divided into two parts of an inner peripheral part and an outer peripheral part.

13. The plasma processing apparatus of claim 2, wherein at least three lower openings of the at least three through holes of the second ring are widened downwardly.

14. The plasma processing apparatus of claim 2, wherein each of the first holding segment of the at least three lifter pins is inserted into the corresponding through hole of the at least three through holes formed at the inner peripheral portion of the second ring with a clearance therebetween.

15. The plasma processing apparatus of claim 2, wherein each of the second holding segment of the at least three lifter pins has a shape that does not allow the second holding segment to fit into the through hole formed at the inner peripheral portion of the second ring so that the second holding segment functions as a support.

16. The plasma processing apparatus of claim 2, wherein each of the at least three lifter pins has an inclined part between the first holding segment and the second holding segment, the inclined part being formed as its cross-sectional area is gradually increased from the first holding segment to the second holding segment.

17. The plasma processing apparatus of claim 2, wherein each of the at least three lifter pins has a flange disposed between the first holding segment and the second holding segment, the flange having a diameter greater than that of the second holding segment.

* * * * *